United States Patent [19]

Moslehi et al.

[11] Patent Number: 4,888,087
[45] Date of Patent: Dec. 19, 1989

[54] PLANARIZED MULTILEVEL INTERCONNECTION FOR INTEGRATED CIRCUITS

[75] Inventors: Mehrdad M. Moslehi, Collin County, Tex.; Krishna C. Saraswat, Santa Clara County, Calif.

[73] Assignee: The Board of Trustees of the Leland Stanford Junior University, Stanford, Calif.

[21] Appl. No.: 283,738

[22] Filed: Dec. 13, 1988

[51] Int. Cl.4 .................. H01L 21/306; B44C 1/22; C03C 15/00; C03C 25/06

[52] U.S. Cl. .................. 156/643; 156/644; 156/651; 156/653; 156/656; 156/657; 156/659.1; 156/662; 437/203

[58] Field of Search ............... 156/643, 644, 651, 653, 156/656, 657, 659.1, 661.1, 662; 437/192, 193, 205, 228, 233, 238, 241, 245, 247, 920

[56] References Cited

U.S. PATENT DOCUMENTS

| | | | |
|---|---|---|---|
| 4,689,113 | 8/1987 | Balasubramanyam et al. | 156/653 X |
| 4,764,484 | 8/1988 | Mo | 437/203 |
| 4,800,176 | 1/1989 | Kakumu et al. | 437/203 X |

*Primary Examiner*—William A. Powell
*Attorney, Agent, or Firm*—Flehr, Hohbach, Test, Albritton & Herbert

[57] ABSTRACT

A process sequence for forming a multilevel tungsten interconnect array begins from a device level already planarized; alternate layers of silicon nitride and oxide are deposited. Via holes are then defined by masking, and anisotropically etched entirely through the nitride and oxide layers down to the device level (by reactive ion etching). Then the trenches for metal lines are defined intermediate the via holes and selectively plasma etched through the topmost layer of nitride and the topmost layer of dielectric, stopping atop the second layer of nitride. The oxide sidewalls of the metal line trenches and via holes are then etched laterally, using a wet etching process that results in much slower etching of the nitride layer so that nitride overhangs are formed that will protect the oxide sidewalls during subsequent vertical etchings. A layer of polysilicon is then deposited conformally which also covers the interior surface of each metal line trench and via hole, and an anisotropic etch performed so that the excess polysilicon is etched off from the top of the dielectric layer and the bottom of the trench is again open to the nitride surface and the bottom of the via hole is open to the device layer. Now the tungsten is deposited selectively, which will grow laterally in the trenches and via holes, filling them by lateral deposition after which processing is completed by a final annealing process to consume the excess polysilicon by tungsten.

18 Claims, 3 Drawing Sheets

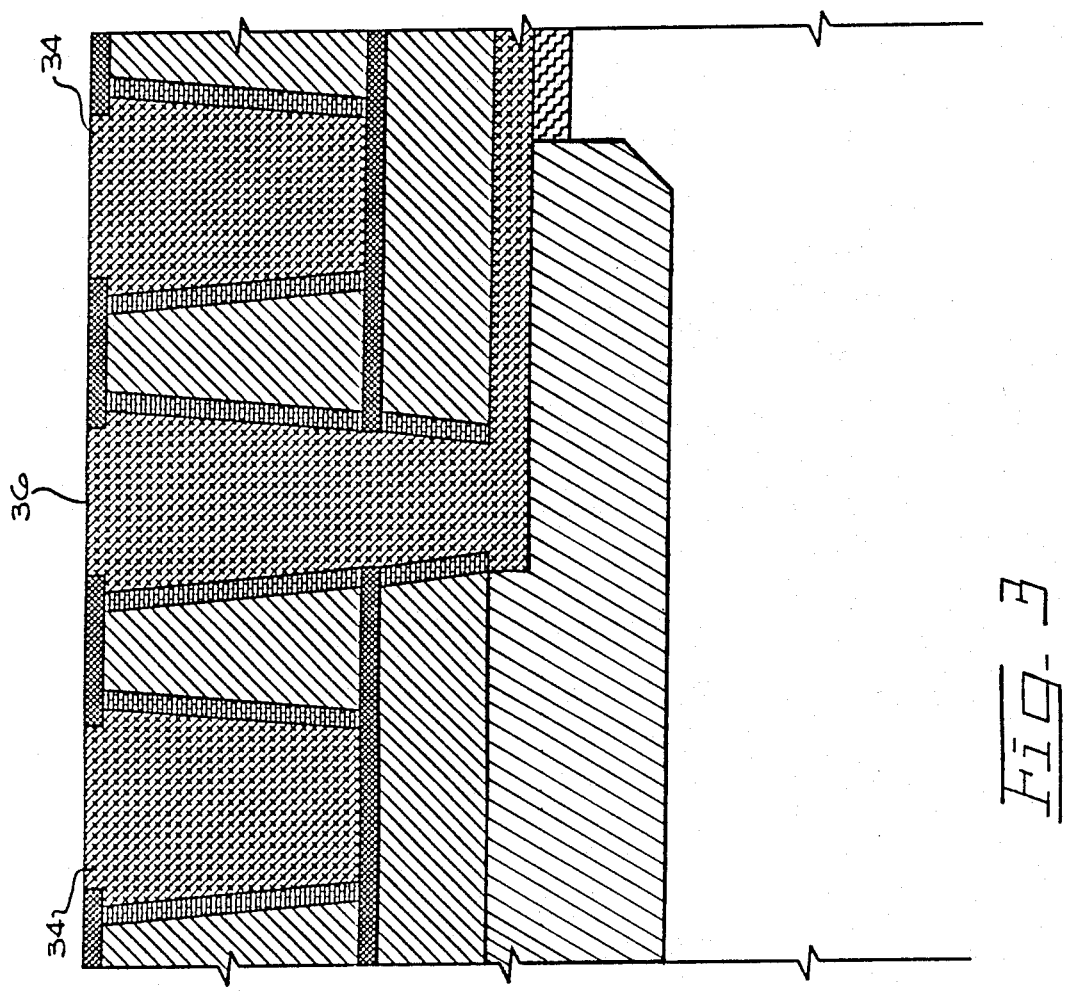

PLANARIZED MULTILEVEL INTERCONNECTION FOR INTEGRATED CIRCUITS

FIELD OF THE INVENTION

This invention is generally related to the field of microelectronics and a method of forming electrical interconnects for an integrated circuit, and more particularly to a multilevel interconnection technology for use in high-density integrated circuits.

BACKGROUND OF THE INVENTION

In the production of monolithic integrated circuit chips, many elements are typically produced in the surface layer of the chip. These elements may comprise resistors, diodes, NPN or PNP bipolar transistors or insulated-gate field effect transistors of the N or P channel type, as examples. The several elements, when completed, are connected together to provide such circuit components as flip-flop circuits, digital logic circuit elements, or memory circuits, to name but a few. Then the circuit building blocks are connected together to provide a functional circuit, and the circuit input and output terminals are connected to external terminals through the pads on the chip.

All the connections between the elements that do not cross are typically made in a single level. That is, a layer of insulation, typically oxide, is provided either during construction of the elements of the chip, or in a later step over the exposed surface of the chip that contains the many circuit elements. Holes are provided in this layer to permit making connections to the elements. Patterned conductors are then applied to the surface of the insulating layer as necessary to provide the connections that can be most efficiently made without crossing any of the lines.

Then a second layer of insulation is put over the first layer of conductors. Holes are made in the second layer of insulation to permit connections to points on the first layer of connections or to the underlying substrate where the circuit elements are located. Then a second layer of conductors is applied over the second layer of insulator. This second layer crosses the first layer as is necessary but is insulated therefrom by the second layer of insulation. This process is repeated as often as the circuit design complexity and performance requires.

As the elements in the underlying substrate become smaller and smaller, and the circuits become denser and more complicated, these wiring connections have effectively come into play as imposing limits on the packing density of elements which can be achieved. In fact, in some complex chips the metal lines occupy a larger fraction of the total chip surface area than the active elements in the substrate because of the complexity of the interconnections and the need to separate the lines sufficiently to avoid capacitance, cross talk and related fabrication problems.

The typical approach to forming the connecting lines in today's technology is to sputter aluminum or an alloy of aluminum over the dielectric surface and then pattern and etch the aluminum. After one layer of metal is in place, the dielectric is put down over it. This results in problems with achieving planarization of the surface of the dielectric layer. Such planarization is necessary to be able to get accurate lithography in defining the placement of the upper layers of connections over the surface of the dielectric because with a lack of planarization, the depth of focus to the surface of the integrated circuit will change for spatially distributed points on the chip. Moreover, achieving a planarized surface layer helps to improve the circuit yield and scalability.

Past efforts to overcome this problem have focused on putting a layer of oxide over each layer of metal lines and then spinning on glass or photo resist. This layer, since it is fluid, can be processed to harden into a relatively smooth surface. However, this requires additional baking, and etching and deposition steps to achieve the proper thickness of the planarized oxide dielectric between metal layers, and can be an expensive, time consuming and difficult process to reliably reproduce.

Further, as the width of the aluminum wires used to define the circuit patterns is scaled down to the submicron regime, problems are created in handling the required current densities through these extremely fine metal line widths. That is, at high current densities, metal lines can be cut open or adjacent metal lines can short together because of movement of the atoms of aluminum caused by the momentum of the electrons established by the high current densities (electromigration failures).

It has been found that metals such as tungsten are much more resistant to problems such as electromigration failures described above. However, tungsten offers a resistance level that is about two times higher than that of aluminum. Therefore, the problem becomes to incorporate a sufficient thickness of tungsten to define a metal interconnect line having relatively low resistance without creating even greater planarization problems than those posed by the use of aluminum lines.

A further problem is to avoid the need for dry etching or plasma etching of the metal lines which is used to transfer the desired pattern of the lines to the surface of the integrated circuit.

SUMMARY OF THE INVENTION

It is an object of this invention to provide an improved method for providing a planarized multilevel interconnection system for an integrated circuit.

More particularly, it is an objective of this invention to provide a process for incorporating a tungsten metallization system in an advanced VLSI circuit.

The above objectives are achieved in the following process sequence for forming a multilevel tungsten 10 interconnect array. Beginning from a device level already planarized, alternate layers of silicon nitride, oxide, nitride, oxide, and nitride are deposited, although the first layer of nitride may not be essential. Via holes which are to extend through the top layer of nitride entirely down to the device level are then defined by masking, and anisotropically etched entirely through the nitride and oxide layers down to the device level (by reactive ion etching). Then the trenches for metal lines are defined intermediate the via holes and etched through the topmost layer of nitride and the topmost layer of dielectric, stopping atop the second layer of nitride. This etching process is performed by a plasma etching process which has a good selectivity between oxide and nitride. The oxide sidewalls of the metal line trenches and via holes are then etched laterally, using a wet etching process that results in much slower etching of the nitride layer so that nitride overhangs are formed that will protect the oxide sidewalls during subsequent vertical etchings. A layer of polysilicon is then deposited conformally which also covers the interior surface of each metal line trench and via hole, and an anisotropic etch performed so that the excess polysilicon is etched off from the top of the dielectric layer and the bottom of the trench is again open to the nitride surface and the bottom of the via hole is open to the device layer. Now the tungsten is deposited selectively, which will grow laterally in the trenches and via holes, filling them by lateral deposition after which processing is completed by a final annealing process to consume the excess polysilicon by tungsten.

The technique has a number of advantages including the fact that it is very attractive for multilevel metallization with submicron metal pitches.

The technique does not employ metal etching because the metallization is performed after formation of dielectric trenches. Tungsten only fills the dielectric trenches, eliminating the need for metal etching.

The surface of each metallization level is fully planarized after deposition of tungsten into the dielectric trenches; therefore, no postmetallization dielectric planarization is required.

Both the metal interconnect lines and level to level connections through the via holes are formed simultaneously during one step of the selective tungsten deposition process.

Because pure tungsten is used for metal lines and vias, this metallization system is electromigration-resistant and hillock-free, and can tolerate high processing temperatures.

The interlevel layered dielectric can be formed by conventional (nonplasma) dielectric CVD processes because tungsten metallization can stand very high processing temperatures.

Low-resistivity metal lines with 0.05 ohm per square sheet resistance can be obtained with a 1 $\mu$metallization thickness.

BRIEF DESCRIPTION OF THE DRAWINGS

Other features and advantages of this invention will become apparent by reviewing the disclosure of a preferred embodiment of the process given with respect to the following figures:

FIG. 3 illustrates the formation of tungsten lines and vias filling the defined via holes and dielectric trenches.

DETAILED DESCRIPTION OF A PREFERRED EMBODIMENT

The process to be disclosed below results in a fully planarized interconnect system. The process starts from a device level already planarized, for example, by the use of a fully recessed field oxide 4 as shown in FIG. 2 and/or the use of recessed gate transistors or transistors with thin metal gate electrodes (with the source region of transistor represented by the n+region 6 shown in FIG. 3).

Figure 1:
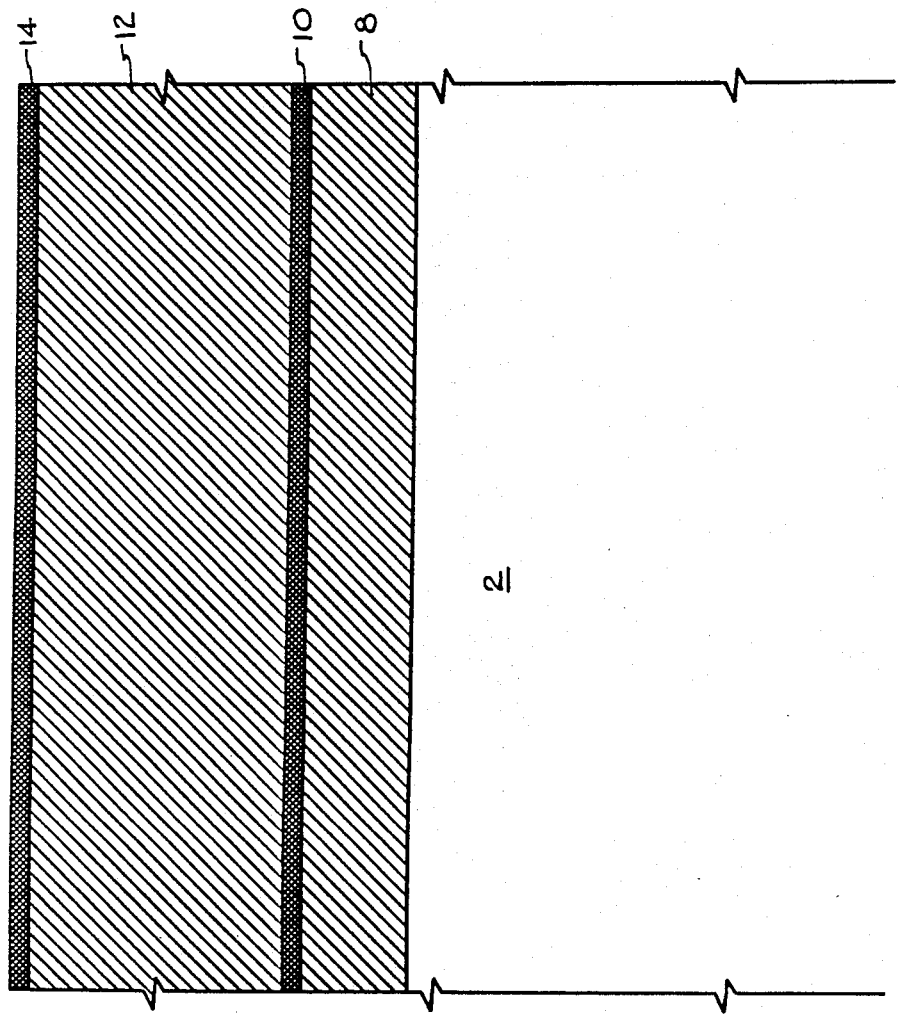
FIG. 1 is a vertical section through a device level substrate showing the formation of oxide dielectric and nitride layers.

Returning to FIG. 1, as a first step in the process, although this is optional, a thin layer (800 Å) of silicon nitride may be deposited by LPCVD (low pressure chemical-vapor deposition) process over the top of the device level comprising the silicon substrate 2 or the like for passivation purposes. Thereafter, a 0.5 micron (5000 Å) dielectric layer 8 preferably comprising silicon dioxide is laid down followed by the deposit of an 800 Å layer 10 of silicon nitride also placed by LPCVD. Thereafter, a second layer 12 of silicon dioxide 1 micron thick is deposited. Finally, a second layer 14 oil silicon nitride 800 Å thick is deposited. All of these deposition steps may be done sequentially in situ in one LPCVD reactor.

It will be seen that the upper level of oxide 12 is the region where the metal lines are formed. The reason for this is that they are of twice the typical thickness of aluminum lines because of the higher resistivity of tungsten. The upper and lower levels 8, 12 of dielectric are where the via holes will be formed as will be explained. Of course, because of the added thickness of the metal lines and via holes, there is an increased possibility of capacitive coupling and cross-talk between adjacent metal lines. Therefore, in the process below, steps will be taken to minimize the possibility of such undesirable coupling.

Figure 2:
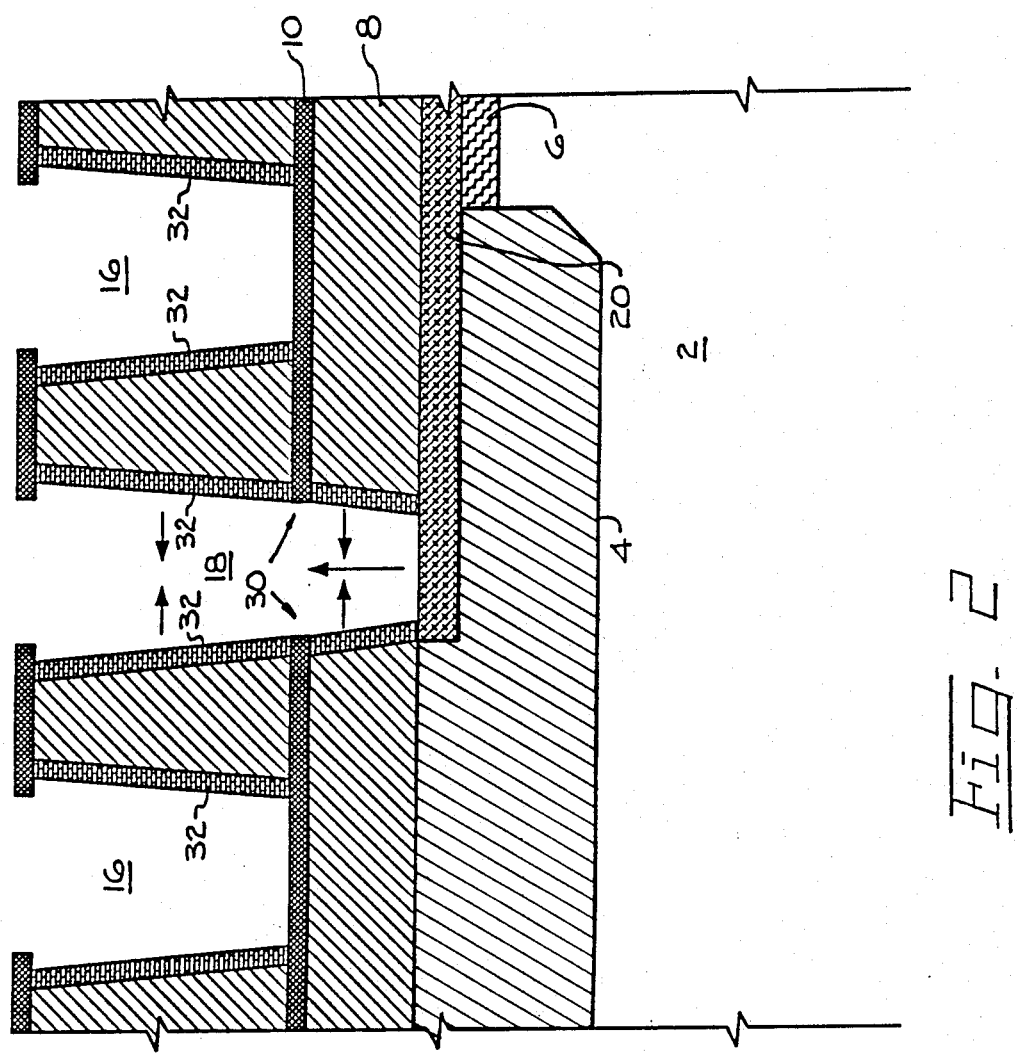
FIG. 2 illustrates the formation of via holes and metal line trenches through the oxide dielectric and nitride layers.

Referring to FIG. 2, the distinction between the metal lines location 16 and the location of the via holes 18 is clearly apparent. The via holes 18 will be used to connect vertically separate levels of metal lines as represented by the darkened line 20 that appears at the top of the planarized substrate 2 on which the present process is being executed.

In order to form the via holes and metal lines, an anisotropic plasma etching or reactive ion etching is used to make the desired vertical etches. This etching process, as shown in FIG. 2, begins by defining the location of the via holes 18 by microlithography, then etching the top layer 14 of nitride, the layer 12 of oxide, the layer 10 of nitride, and finally the bottom oxide layer 8. If a bottom layer of nitride directly over the planarized surface has been provided, this is also etched through.

As a next step, to define the location of the metal line trenches 16, the reverse image of a metal mask is used to define these metal line positions by photoresist. Then a reactive ion etching (RIE) is used to etch the top nitride 14 and then the top layer of oxide 12. The etching in this step is stopped at the top of the intermediate layer of nitride 10. This is done by choosing an etching process which has a good selectivity between oxide and nitride.

The next step is to recess the sidewalls of the via holes 18 and metal line trenches 16. This is done by performing a quick (25 second) wet oxide etch in buffered HF to recess the oxides defining the substantially vertical sidewalls laterally by about 500 Å on each sidewall. The nitride layers 14, 10 will etch slowly and as a result, nitride overhangs will appear that will protect the oxide sidewalls of each trench 16 and via 18 during subsequent reactive ion etching.

The next step is to deposit a conformal layer of polysilicon, preferably about 400 Å thickness over the exposed surfaces including the interior surface of the metal line trenches 16 and via holes 18.

The following step is to perform a blanket reactive ion etch of this polysilicon 32, i.e., anisotropic etch, so that the polysilicon 32 remains only on the sidewalls of dielectric trenches 16 and via holes 18.

Next, tungsten is deposited by selective chemical vapor deposition. As shown in FIG. 3, the tungsten in the metal trench 34 and via holes 36 will nucleate and grow laterally in the trenches and holes. Therefore, they will be filled by a lateral deposition process. For half micron lines, the deposition time of approximately 2500 Å tungsten is sufficient to fill the trenches and via holes. Finally, the wafer is annealed by rapid thermal processing in order to consume the excess polysilicon by reaction with tungsten.

The layer of metallization shown in FIG. 3 is complete after this step, and the wafers are ready for the next level of metal by deposition of appropriate alternating layers (nitride, oxide, nitride, oxide, nitride) and going through the processing steps explained above.

The only limitation so far apparent for this interconnection technique is that the metal lines on each level should have one global width because the metal lines are formed by lateral deposition of tungsten. If wider metal lines are also required, they should be broken into integer multiples of the nominal minimum metal line width.

Other alternatives of this invention may become apparent to a person of skill in the art who studies this disclosure. Therefore, the scope of this invention is to be limited only by the following claims.

What is claimed:

1. A method of forming a tungsten interconnection array for an integrated circuit comprising the steps of
on a device level of said integrated circuit which is already planarized, forming a thin first layer of nitride covered by a thick first layer of oxide,
forming a second layer of nitride over said first oxide, forming a thick second layer of oxide over said second layer of nitride, forming a thin third layer of nitride over said second layer of oxide,
defining the location of via holes which are to extend through said first and second layers of oxide and said first, second and third layers of nitride by etching said third nitride layer to define the location of metal lines, anisotropically etching said second oxide layer, said second etching nitride layer and said first oxide layer to create oxide trenches with substantially vertical sidewalls defining said via holes,
etching through said nitride layer to open said holes to the underlying planarized device,
depositing tungsten in said via holes to fill said via holes to the level of the third nitride and form a planarized surface having a complete level of metallization.

2. A method as in claim 1 further including following said anisotropic etch of said oxide layers the steps of defining the positions of metal lines trenches over said device, and etching said third layer of nitride and said second layer of oxide stopping at said second layer of nitride to define said metal line trenches with substantially vertical sidewalls in said oxide.

3. A method as in claim 2 including the step following anisotropic etching of said oxide layer of etching the vertical sidewalls of said trenches and said via holes to recess said sidewalls and establish nitride overhangs which protect the sidewalls and cooperate with the tungsten to form a stable enclosed structure.

4. A method as in claim 3 wherein the planarized device level is a silicon integrated circuit substrate.

5. A method as in claim 4 wherein said anisotropic etching is carried out using reactive ion etching using RF or ECR microwave plasma.

6. A method as in claim 3 including the further steps following the steps of etching said sidewalls of depositing a layer of polysilicon over the exposed surface areas including said trench and said via holes, and anisotropically etching said polysilicon so that it covers only said vertical sidewalls of said trench and said via holes.

7. A method as in claim 6 wherein said oxide is in the range of 5000 Å to 10,000 Å, and said nitride layers are each about 800 Å.

8. A method as in claim 7 wherein said polysilicon has a thickness of about 400 Å.

9. A method as in claim 6 wherein said tungsten is deposited by selective chemical-vapor deposition, filling the trenches by lateral deposition of tungsten followed by annealing.

10. A method as in claim 9 including the step of etching said second nitride layer with a slight slope so that said via hole extending through said first oxide is narrower than the via hole through said second oxide.

11. A method of forming a tungsten interconnection array for an integrated circuit comprising the steps of
on a device level of said integrated circuit which is already planarized, forming a thin first layer of nitride covered by a thick first layer of oxide,
forming a second layer of nitride over said oxide,
etching said second nitride layer to defining the location of metal lines,
anisotropically etching said oxide layer to create oxide trenches with substantially vertical sidewalls defining said metal lines,
etching through said nitride layer to open said trenches to the underlying planarized device,
depositing tungsten in said trenches to fill said trenches to the level of the nitride and form a planarized surface having a complete level of metallization.

12. A method as in claim 10 including the step following anisotropic etching of said oxide layer of etching the vertical sidewalls of said trenches to recess said sidewalls and establish nitride overhangs which protect the sidewalls and cooperate with the tungsten to form a stable structure.

13. A method as in claim 12 wherein the planarized device level is a silicon integrated circuit substrate.

14. A method as in claim 13 wherein said anisotropic etching is carried out using reactive ion etching in RF or ECR microwave plasma.

15. A method as in claim 14 including the further steps following the steps of etching said sidewalls of depositing a layer of polysilicon over the exposed surface area of said trench, and anisotropically etching said polysilicon so that it covers only said vertical sidewalls of said trench.

16. A method as in claim 15 wherein said oxide is in the range of 5000 Å to 10,000 Å, and said nitride layers are each about 800 Å.

17. A method as in claim 16 wherein said polysilicon has a thickness of about 400 Å.

18. A method as in claim 14 wherein said tungsten is deposited by selective chemical-vapor deposition, filling the trenches by lateral deposition of tungsten followed by annealing to consume the excess silicon left on the trench and via hole sidewalls.

* * * * *

UNITED STATES PATENT AND TRADEMARK OFFICE
CERTIFICATE OF CORRECTION

PATENT NO. : 4,888,087

DATED : December 19, 1989

INVENTOR(S) : M. Moslehi et al.

It is certified that error appears in the above-identified patent and that said Letters Patent is hereby corrected as shown below:

Column 1, line 6, insert the following :

--This invention was made with Government support under contract MDA-903-84-K-0062 awarded by the Department of the Army. The Government has certain rights in this invention.--

Signed and Sealed this

Fourth Day of April, 1995

Attest:

BRUCE LEHMAN

Attesting Officer

Commissioner of Patents and Trademarks